United States Patent
Henkel et al.

(10) Patent No.: US 8,170,164 B2
(45) Date of Patent: May 1, 2012

(54) TRANSFER CLOCKS FOR A MULTI-CHANNEL ARCHITECTURE

(75) Inventors: Thomas Henkel, Boblingen (DE); Ralf Killig, Grafenau (DE)

(73) Assignee: Advantest (Singapore) Pte Ltd, Singaproe (SG)

( * ) Notice: Subject to any disclaimer, the term of this patent is extended or adjusted under 35 U.S.C. 154(b) by 2377 days.

(21) Appl. No.: 10/830,341

(22) Filed: Apr. 22, 2004

(65) Prior Publication Data
US 2004/0243870 A1 Dec. 2, 2004

(30) Foreign Application Priority Data
May 30, 2003 (EP) .................................... 03101576

(51) Int. Cl.
*H04L 7/00* (2006.01)
(52) U.S. Cl. ........ 375/354; 713/400; 713/500; 713/501; 714/731; 714/744; 375/224; 327/141
(58) Field of Classification Search ................. 375/224, 375/354; 713/400, 500, 501; 714/731, 744; 327/141
See application file for complete search history.

(56) References Cited

U.S. PATENT DOCUMENTS

| | | | |
|---|---|---|---|
| 4,979,191 A | 12/1990 | Bond et al. | 375/108 |
| 5,311,486 A * | 5/1994 | Alton et al. | 368/10 |
| 5,721,889 A | 2/1998 | Miller et al. | 395/557 |
| 5,987,540 A | 11/1999 | Hashiguchi | 710/60 |
| 6,021,504 A | 2/2000 | Yamasaki | 713/400 |
| 6,055,644 A | 4/2000 | Henkel | 713/500 |
| 6,549,045 B1 | 4/2003 | Wang et al. | 327/115 |
| 2002/0073350 A1 | 6/2002 | Ehlert et al. | 713/500 |
| 2003/0097600 A1 | 5/2003 | Wong | 713/400 |

* cited by examiner

*Primary Examiner* — Leon Flores
(74) *Attorney, Agent, or Firm* — Holland & Hart LLP

(57) ABSTRACT

A multi-channel architecture comprising a central facility that is under clock control of a central facility's clock signal, and a central transfer clock generator adapted for deriving a central transfer clock signal from the central facility's clock signal. The multi-channel architecture further comprises a set of n channels, with n being a natural number, wherein each channel is under clock control of one out of a plurality of clock signals. Each of the channels comprises a channel transfer clock generator adapted for deriving a channel transfer clock signal from a clock signal of the respective channel, wherein the central facility's clock signal and the clock signals of the channels comprise at least two different clock signals. The transfer clock period of the central transfer clock signal is substantially equal to each of the transfer clock periods of the channel transfer clock signals.

30 Claims, 4 Drawing Sheets

TRANSFER CLOCKS FOR A MULTI-CHANNEL ARCHITECTURE

BACKGROUND OF THE INVENTION

The present invention relates to providing transfer clock signals that control the exchange of information in a multi-channel architecture.

In a multi-channel architecture that comprises a central facility and a set of channels, information has to be exchanged between the central facility and the channels. On the part of the channels, there might exist a multitude of local clock signals, and if these local clock signals were employed for clocking the data transfer, the timing of said data transfer would not be predictable. For many applications, it is important that messages or commands are received synchronously, though.

SUMMARY OF THE INVENTION

It is an object of the invention to provide an improved transfer of information in a multi-channel architecture. The object is solved by the independent claims. Preferred embodiments are shown by the dependent claims.

The multi-channel architecture according to embodiments of the present invention comprises a central facility that is controlled by a central facility's clock signal, and a central transfer clock generator that derives a central transfer clock signal from the central facility's clock signal. Furthermore, the multi-channel architecture comprises a set of n channels, with n being a natural number, and with each one of said channels being controlled by one out of a plurality of clock signals. Said central facility's clock signal and said clock signals of the channels comprise at least two different clock signals. Each of the channels comprises a channel transfer clock generator that derives a channel transfer clock signal from a clock signal of the respective channel, wherein the transfer clock period of said central transfer clock signal is substantially equal to each of the transfer clock periods of said channel transfer clock signals.

Both on the part of the central facility and on the part of the channels, transfer clock signals are derived from the respective local clock signals. Though there might exist a multitude of different local clock signals within the system, said transfer clock signals are generated in a way that their respective transfer clock periods are substantially equal to each other. These transfer clock signals control the transmission of data, commands and messages between the channels and the central facility. By employing said transfer clock signals, a reliable signal transmission and well-defined timing conditions are established. Even if there exists a large variety of different local clock signals with arbitrary phase relations relative to each other, the set of transfer clock signals allows to avoid unpredictable results. According to a preferred embodiment, the common transfer clock period is chosen in accordance with runtime delays between the central facility and the channels.

According to a preferred embodiment of the invention, the transfer of at least one of commands and messages between said central facility and said channels is performed under clock control of the transfer clock signals. On the part of the central facility, said messages or commands are sent and received in accordance with the central transfer clock signal, and on the part of a respective channel, the messages and commands are sent and received in accordance with the respective channel transfer clock signal. Said transfer clock signals permit to establish a reliable exchange of messages or commands between the central facility and the channels.

According to another preferred embodiment of the invention, the common transfer clock period of the transfer clock signals is substantially a common multiple of the signal periods of the central facility's clock signal and the clock signals of the channels. Within the multi-channel architecture, there might exist a variety of different clock signal periods. In order to adapt the system to the respective external requirements, it might even be necessary to reprogram the local clock signal periods, and therefore, the clock signal periods of the local clock signals might vary as a function of time. In any case, the common transfer clock period can be set to a common multiple of the system's relevant clock signal periods. Once the common transfer clock period is known, a central transfer clock signal can be derived from the central facility's clock signal, and channel transfer clock signals can be derived from the respective clock signals of the n channels.

In another preferred embodiment of the invention, at least some of the n channels supply other channels with their respective channel transfer clock signals. If some of the channels comprise channel transfer clock generators, they will be able to supply other channels with respective channel transfer clock signals. Thus, it is not necessary to provide one dedicated channel transfer clock generator per channel.

According to another preferred embodiment of the invention, at least some of the transfer clock generators might be implemented as programmable transfer clock generators. If one or more of the local clock frequencies are reprogrammed, it will be necessary to change the setting of the corresponding transfer clock generator in accordance with the modified local clock frequency. By means of a programmable transfer clock generator, it is possible to convert any local clock signal into the desired transfer clock signal.

Preferably, the central transfer clock generator comprises a first superperiod counter, with the transfer clock signal period generated by said first superperiod counter comprising $2k_0$ cycles of the central facility's clock signal, whereby $k_0$ is a natural number. Said first superperiod counter counts either the rising edges or the falling edges of the central facility's clock signal and generates one period of the central transfer clock signal for every $2k_0$ periods of the central facility's clock signal.

According to a preferred embodiment of the invention, at least some of said channel transfer clock generators are implemented by means of second superperiod counters. In the following, the transfer clock signal periods generated by a second superperiod counter of the j-th channel comprise $2k_j$ cycles of the respective channel clock signal, whereby $k_j$ with $j=1, \ldots, n$ are natural numbers, and whereby $j=1, \ldots, n$ denotes the respective channel. Said second superperiod counters generate one signal period of the respective channel transfer clock signal per $2k_j$ signal periods of the j-th channel's clock signal.

According to a preferred embodiment of the invention, at least one of the counter cycle $k_0$ of the first superperiod counter and the counter cycles $k_1, \ldots, k_n$ of the second superperiod counters may be programmed or reprogrammed by said central facility. For example, said first and said second superperiod counters may comprise dedicated registers adapted for storing the respective counter cycle. The central facility might e.g. determine the set of counter cycles $k_0, k_1, \ldots k_n$ in dependence on the current set of local clock frequencies, whereby the counter cycles $k_0, k_1, \ldots k_n$ are determined in a way that all said first and said second superperiod counters generate transfer clock signals of one common transfer clock period.

According to another preferred embodiment of the invention, said central facility might additionally program or reprogram the respective initial values of at least one of the superperiod counters. On the part of the superperiod counters, counting is started at said initial values. For this reason, the respective initial value determines the phase shift of the corresponding transfer clock signal generated by a respective one of said first and said second superperiod counters. By programming the initial values accordingly, any desired phase relation between the central transfer clock signal and the channel transfer clock signals can be established.

According to a preferred embodiment of the invention, said channel transfer clock signals are substantially in phase relative to each other. This might e.g. be accomplished by providing suitable initial values to said second superperiod counters. As soon as synchronous channel transfer clock signals are available on the part of the channels, the channels can send their respective messages to the central facility in a synchronized way. Furthermore, a command or a message that is sent by the central facility is received synchronously on the part of the channels.

According to another preferred embodiment, the phase shift between the central transfer clock signal and the channel transfer clock signals lies somewhere in the range between 0.55 and 0.95 signal periods of the transfer clock signal. The common transfer clock period of the channel transfer clocks and the central transfer clock might e.g. be chosen in a way that the worst case runtime delay of messages or commands that are exchanged between the central facility and the channels is considerably smaller than 0.55 to 0.95 transfer clock periods. In case the signal period of the transfer clock signals is sufficiently large, a respective message or command may be sent with a rising edge of the transfer clock signal that leads in phase, and may be received with a subsequent rising edge of the transfer clock signal that lags in phase.

Preferably, there is a phase shift of approximately 0.75 transfer clock periods between the central transfer clock signal and the channel transfer clock signals, which corresponds to a 270° phase shift. If the transfer clock period is chosen sufficiently large that the transmission of a respective message or command can be completed during 0.75 transfer clock periods, a secure and efficient transfer of commands and messages between the channels and the central facility will be possible.

Let us assume that the central transfer clock signal leads in phase relative to the channel transfer clock signals. According to a preferred embodiment, a command or message is sent from the central facility to the channels with a rising edge of the central transfer clock signal, and is received on the part of the channels with a rising edge of the respective channel transfer clock signal. The time delay between the rising edge of the central transfer clock signal and the subsequent rising edge of the respective channel transfer clock signal corresponds to the phase shift between said two transfer clock signals which is preferably (but not necessarily) equal to 270°.

According to another preferred embodiment of the invention, a command or message is sent from a respective channel to the central facility with a falling edge of the respective channel transfer clock signal, and is received on the part of the central facility with a rising edge of the central transfer clock signal. Further preferably, the relative phase shift is substantially equal to 0.75 transfer clock periods. When assuming that the central transfer clock signal leads in phase relative to the channel transfer clock signals, the time delay between a falling edge of a respective channel transfer clock signal and a subsequent rising edge of the central transfer clock signal will be equal to 0.75 transfer clock periods as well. In this embodiment of the invention, both the data accumulation time in the direction from the central facility to the channels and the data accumulation time from the channels to the central facility is equal to 0.75 transfer clock periods. Due to the symmetric distribution of the data accumulation time, an exchange of commands and messages both in the forward and in the backward direction can be carried out within as few as two transfer clock cycles.

In a preferred embodiment of the invention, the clock signals of the central facility and the channels are chosen from a set of master clock signals. Said clock signals of the central facility and the channels are then used as a starting point for deriving the respective transfer clock signals.

Preferably, the multi-channel-architecture according to embodiments of the present invention is employed in an automated test equipment (ATE) that is adapted for testing at least one device under test (DUT). Preferably, at least some of the channels of the multi-channel architecture are responsible for at least one of: providing stimulus signals to the at least one DUT and receiving response signals from said at least one DUT. Preferably, the automated test equipment is adapted for testing integrated circuits. Modern integrated circuits may comprise a plurality of different functional units, whereby said functional units might be under clock control of various different clock frequencies. As a consequence, a set of different clock frequencies might be required for testing the functional units of a DUT. For example, the memory unit of the DUT might have to be tested with a first clock frequency, while for testing the DUT's processing unit, a second clock frequency might be required. Therefore, the channels of the automated test equipment are operated at various different clock frequencies. By means of embodiments of the present invention, it is possible to accomplish a well-defined and secure exchange of commands and messages between the central facility and the channels by deriving dedicated transfer clock signals from the various different clock frequencies within the ATE.

If the transfer clock signals on the part of the channels are synchronized relative to each other, it will be possible to start the generation of test patterns synchronously on the part of the channels. In order to start the generation of test data, a command "RUN" might be transmitted from the central facility to the channels. Furthermore, it might become necessary, during the testing, to change the timing of signal transitions within the test pattern. For this purpose, a message "EGR" (Edge Generate Ready) is forwarded from the respective channel to the central facility, and in response to this message, the channels'clock signals are disabled during one clock cycle, and the timing of the edges is reprogrammed. By utilizing a set of synchronized transfer clock signals on the part of the channels, all the tasks that have been described so far (and other tasks that have not been described yet) can be carried out in a synchronized way. Random timing conditions and unpredictable phase relations are avoided.

According to another preferred embodiment of the invention, the automated test equipment comprises at least two different test sites. Thus, the channels of the ATE can be used for testing two or more DUTs simultaneously. Said at least two DUTs might be of the same kind, but it is also possible to test different DUTs simultaneously.

If the ATE comprises two or more test sites, the commands and messages are preferably transmitted in a time-multiplexed mode between the central facility and the respective channels. According to this embodiment, at least one time slot is assigned to each one of the test sites, and commands and messages that correspond to a certain test site are transmitted during the at least one time slot assigned to said test site.

The invention can be partly or entirely embodied or supported by one or more suitable software programs, which can be stored on or otherwise provided by any kind of data carrier, and which might be executed in or by any suitable data processing unit. Software programs or routines are preferably applied for controlling and coordinating the generation of the transfer clock signals.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF EMBODIMENTS OF THE INVENTION

Figure 1:
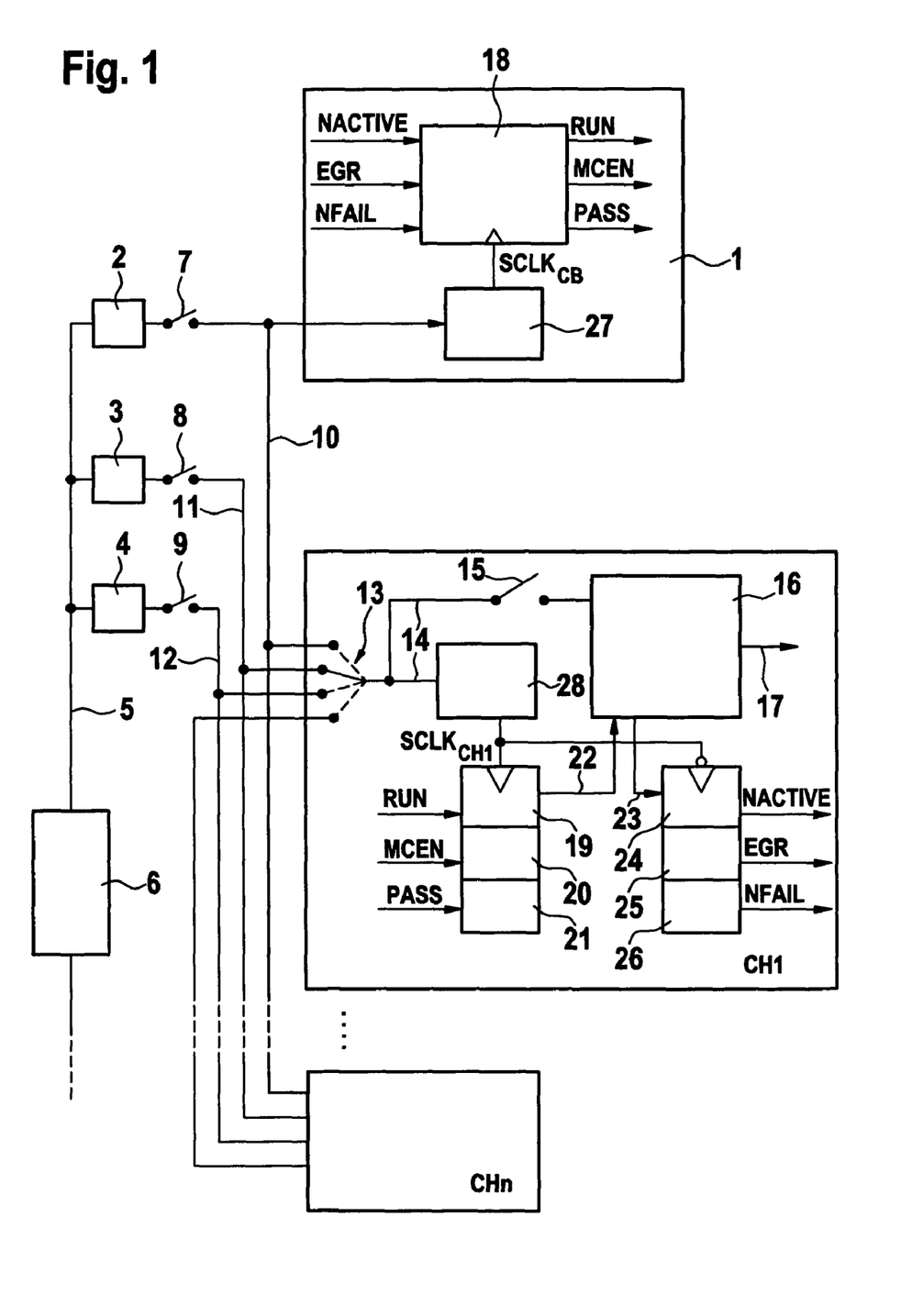
FIG. 1 shows a multi-channel architecture comprising a central control facility and a plurality of channels.

FIG. 1 gives an overview of a multi-channel architecture comprising a central control facility 1 and a plurality of channels CH1, CH2, ..., CHn. Besides that, the system shown in FIG. 1 comprises a plurality of clock signal generators. The system of FIG. 1 might e.g. be used in an automated test equipment (ATE) adapted for testing at least one DUT, whereby a respective DUT might e.g. be an integrated circuit or an electronic device. A channel of the multi-channel architecture might e.g. generate and apply a stream of stimulus data (also called vector data) to at least one DUT. A channel of the multi-channel architecture might as well receive and analyze response signals from a DUT. It has to be stressed that the system shown in FIG. 1 doesn't necessarily have to be employed in an automated test equipment. The multi-channel architecture might be employed wherever stimulus signals have to be generated, or wherever signals have to be evaluated.

In order to generate the required stimulus signals, the n channels CH1, CH2, ..., CHn might have to be supplied with clock signals of various different clock frequencies. These clock signals are provided by a set of clock signal generators 2, 3, 4, .... As a reference, a reference clock signal 5 is supplied to each one of the clock signal generators, whereby the reference clock signal 5 is generated by a reference clock generator 6. At the output of the first clock signal generator 2, a first master clock signal MCLK1 is obtained, which might e.g. have a signal period of 2 ns. The second clock signal generator 3 provides a second master clock signal MCLK2 with a clock period of e.g. 3 ns. At the output of clock signal generator 4, the clock signal MCLK3 is obtained. By means of switches 7, 8, 9, the respective master clock signals can be connected with signal lines 10, 11, 12, ... that are routed to the system's channels.

The channels might comprise selection means for selecting one of the master clock signals MCLK1, MCLK2, MCLK3, ... as a respective channel clock. The channel CH1 comprises selection means 13 that select one of the master clock signals, e.g. the signal MCLK2, as a channel clock signal 14. When the switch 15 is closed, the channel clock signal 14 is supplied to the channel logic 16. There, the channel clock might be used for generating stimulus signals that are provided (17) to a pin of the DUT. Additionally or alternatively, the channel clock signal 14 might be employed for receiving and analyzing DUT response signals on the part of the channel logic 16.

The central control facility 1 is responsible for initiating and coordinating the pattern generation on the various channels. For this purpose, commands and messages are exchanged between the central control facility 1 and the channels CH1, CH2, ..., CHn. For example, when the system shown in FIG. 1 is used in a testing environment, commands such as e.g. RUN, MCEN, might be transmitted from the central control facility 1 to the channels CH1, CH2, ..., CHn. In the opposite direction, each of the channels might transmit messages and commands like e.g. NACTIVE, EGR, NFAIL to the central control facility 1.

There exist a multitude of different clock frequencies within the system. It is required, though, to exchange said commands and messages in a well-defined manner, and to avoid any errors that are due to random phase relations, unpredictable delays, etc. For this purpose, a dedicated transfer clock signal $SCLK_{CB}$, whereby "CB" shall further on denote the "Control Board", is provided on the part of the central control facility 1. Also on the part of a respective channel, e.g. on the part of the channel CH1, a dedicated transfer clock signal $SCLK_{CH1}$ is provided. The central control facility's transfer clock signal $SCLK_{CB}$ might be utilized for sending the messages or commands RUN, MCEN, PASS from the control unit 18 to the channels CH1, CH2, ..., CHn. There, these messages and commands are received by means of dedicated flip-flops, with said flip-flops being clocked by the respective channel's transfer clock signal. For example, the channel CH1 might comprise flip-flops 19, 20, 21 adapted for receiving the messages and commands RUN, MCEN, PASS, and said flip-flops 19, 20, 21 are clocked by the transfer clock signal $SCLK_{CH1}$. The contents of the flip-flops 19, 20, 21 are forwarded, via the signal lines 22, to the channel logic 16.

The channels might also comprise a set of flip-flops for transmitting messages or commands such as NACTIVE, EGR, NFAIL to the central control facility 1. Said flip-flops are clocked by the negative edges of the respective channel's transfer clock signal. For example, the channel CH1 might comprise flip-flops 24, 25, 26 that are adapted for storing the respective messages or commands NACTIVE, EGR, NFAIL provided (23) by the channel logic 16. The flip-flops 24, 25, 26 are clocked by the negative edges of the channel's transfer clock signal $SCLK_{CH1}$, and in accordance with this transfer clock signal, the messages and commands NACTIVE, EGR, NFAIL are transmitted from the channel CH1 to the control unit 18 of the central control facility 1.

There, the messages and commands are received in accordance with the control board's transfer clock signal $SCLK_{CB}$. The transfer clock signal $SCLK_{CB}$ might be obtained from one of the master clock signals MCLK1, MCLK2, MCLK3, ... by means of a clock frequency divider 27. Alternatively, the transfer clock signal $SCLK_{CB}$ might be derived from a dedicated clock signal that is generated on the control board itself. In the embodiment shown in FIG. 1, the transfer clock signal $SCLK_{CB}$ is derived from the first master clock signal MCLK1. The respective transfer clock-signals $SCLK_{CH1}$, $SCLK_{CH2}$, ..., $SCLK_{CHn}$ of the channels CH1, CH2, ..., CHn. might also be derived by means of a clock frequency divider. On the channel CH1, for example, the transfer clock signal $SCLK_{CH1}$ is derived from the channel clock signal 14 by means of a clock frequency divider 28.

Preferably, the signal periods of the transfer clock signals $SCLK_{CB}$, $SCLK_{CH1}$, $SCLK_{CH2}$, ..., $SCLK_{CHn}$ are substantially identical. In case the system of FIG. 1 is used in an automated test equipment, propagation delays of up to 200 ns might occur between the central control facility and the channels. Therefore, the signal period of the transfer clock signals is chosen in the order of 200 to 500 ns. In contrast, the signal periods of the master clock signals might range from 2 to 5 ns. Preferably, the signal period of the transfer clock signals $SCLK_{CB}$ and $SCLK_{CH1}$, ... $SCLK_{CHn}$ is chosen as a common multiple of the master clock signals that are used within the system. Thus, each of the transfer clock signals can easily be derived from any one of the master clock signals MCLK1, MCLK2, ..., because the signal period of the respective transfer clock signal is an integral multiple of the signal period of any master clock signal. For example, the signal period of the control board's transfer clock signal $SCLK_{CB}$ might comprise $k_0$ signal periods of the master clock signal MCLK1, the transfer clock $SCLK_{CH1}$ of the channel CH1 might comprise $k_1$ signal periods of the master clock signal MCLK2, and the transfer clock $SCLK_{CH2}$ might comprise $k_2$ signal periods of the corresponding channel clock signal, etc. whereby $k_0$, $k_1$, ... $k_n$ are integers.

The transfer clocks are derived from the corresponding master clock signals by means of clock frequency dividers, such as for example the clock frequency dividers 27, 28. The clock frequency divider 27 generates one signal period of the transfer clock signal $SCLK_{CB}$ per $k_0$ signal periods of MCLK1. Similarly, at the output of the clock frequency divider 28, one signal period of the transfer clock $SCLK_{CH1}$ is obtained for every $k_1$ signal periods of MCLK2. A clock frequency divider might e.g. be implemented by means of a counter, whereby said counter counts either the rising edges or the falling edges of the respective input signal. The counter has to generate one edge of a transfer clock signal per $k_i$ edges of the corresponding master clock signal, with i=0, 1, ..., n. Therefore, the counter period is set to $k_i$. The counters may be implemented as upward counters or as downward counters. Preferably, the counters are implemented as programmable counters, whereby the counter period may be programmed or reprogrammed by the control unit 18. Further preferably, the initial value of a counter might as well be programmed or reprogrammed by the control unit 18.

Figure 2:
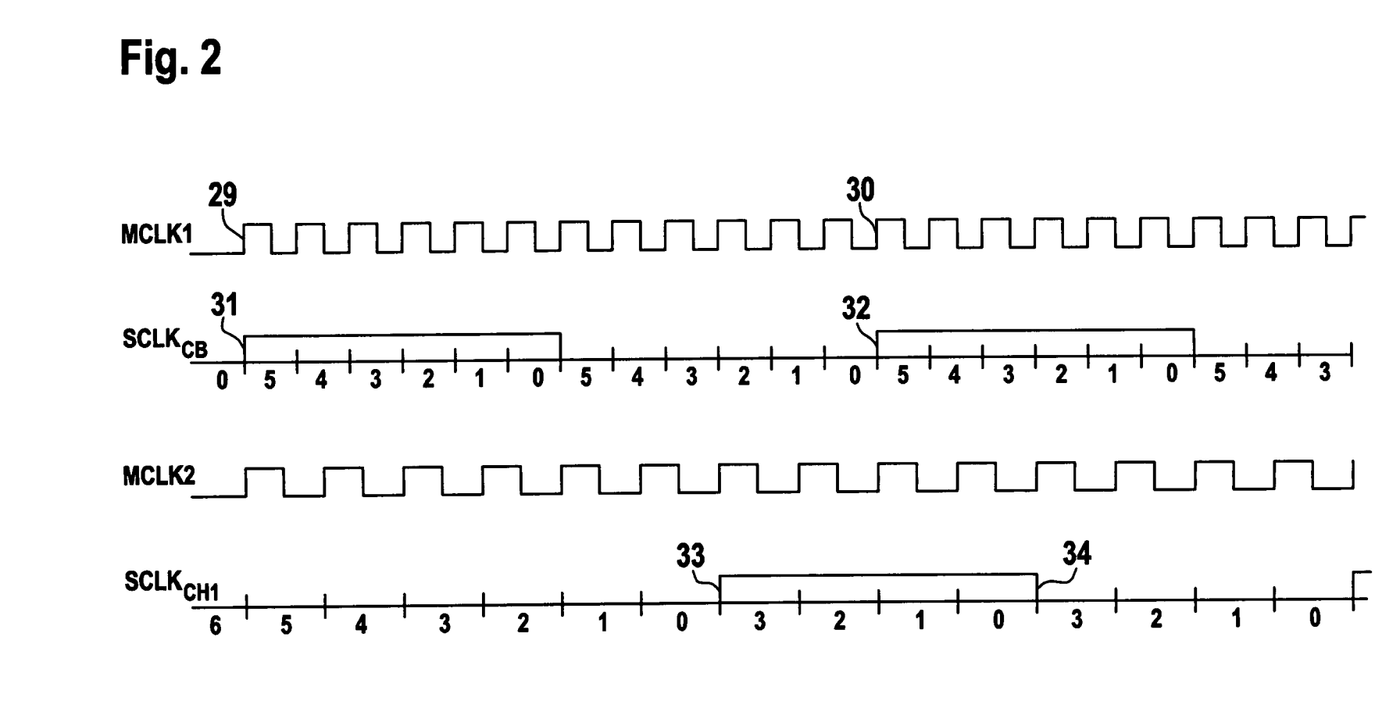
FIG. 2 shows how the transfer clock signals can be derived from the corresponding master clock signals.

In the upper part of FIG. 2, an example is given that shows how the control board's transfer clock signal $SCLK_{CB}$ can be derived from the corresponding master clock signal MCLK1. It is assumed that the signal period of MCLK1 is equal to 2 ns, and that the common signal period of the transfer clock signals is chosen as 24 ns. Therefore, one period of the transfer clock signal $SCLK_{CB}$ comprises $2k_0=12$ signal periods of the corresponding master clock signal MCLK1. This means that for every 12 rising edges of the signal MCLK1, a corresponding rising edge of the transfer clock signal $SCLK_{CB}$ has to be generated. For example, at the edges 29, 30, corresponding edges 31, 32 of the transfer clock signal $SCLK_{CB}$ are generated. In the example of FIG. 2, the clock frequency divider is implemented as a downward counter. Zero is loaded into the counter. With the first positive edge 29 of MCLK1, a positive edge 31 is generated on $SCLK_{CB}$, and $k_0-1=5$ is loaded into the counter. Then, the count value is continuously decremented in accordance with the edges of the master clock signal MCLK1. When the count value 0 is reached, the counter generates a falling edge of $SCLK_{CB}$, and the count value $k_0-1=5$ is loaded into the counter again. In FIG. 2, the respective count values are indicated underneath the transfer clock signal $SCLK_{CB}$. Instead of using a downward counter, it is also possible to implement the clock frequency divider by means of an upward counter that is reset each time when the count $k_0-1=6-1=5$ is reached.

According to a preferred embodiment of the invention, a relative phase shift of approximately 270° is established between the transfer clock signal $SCLK_{CB}$ on the part of the central control facility and the transfer clock signals $SCLK_{CH1}$, $SCLK_{CH2}$, ... $SCLK_{CHn}$ on the part of the channels. A relative phase shift of 270° corresponds to 0.75 clock cycles of a transfer clock signal, whereby a clock cycle is defined as the period of time between successive rising edges of the transfer clock signal. The phase delay doesn't have to be exactly equal to 0.75 transfer clock cycles. The relative phase delay might be somewhere in the range from 0.55 to 0.95 transfer clock cycles.

Preferably, commands and messages are transmitted from the central control facility to the channels as follows: On the part of the central control facility 1, the commands and messages are sent with a rising edge of the channel board's transfer clock signal $SCLK_{CB}$, and on the part of the channels, said messages and commands are received with a subsequent rising edge of the respective channel's transfer clock signal $SCLK_{CHx}$. In the opposite direction, commands and messages are transmitted from at least one channel to the central control facility as follows: On the part of the respective channel, the commands and messages are sent with a falling edge of the channel's transfer clock signal $SCLK_{CHx}$, and on the part of the central control facility 1, these commands and messages are then received with a subsequent rising edge of the control board's transfer clock signal $SCLK_{CB}$. In this embodiment, the complete transmission of messages and commands takes place during the phase shift of approximately 0.75 transfer clock cycles.

In the lower part of FIG. 2, it is shown how the transfer clock signal $SCLK_{CH1}$ of channel CH1 can be derived from the second master clock signal MCLK2. The signal period of the second master clock signal MCLK2 is equal to 3 ns. All the transfer clock signals within the system have a common signal period, and accordingly, the signal period of the transfer clock signal $SCLK_{CH1}$ is equal to 24 ns. Therefore, one signal period of $SCLK_{CH1}$ comprises $2k_1=8$ signal periods of the master clock signal MCLK2. If the transfer clock signal $SCLK_{CH1}$ is derived from MCLK2 by means of a counter, the counter cycle will have to be set to $k_1=8/2=4$.

Preferably, the transfer clock signal $SCLK_{CH1}$ is phase shifted by 270° relative to $SCLK_{CB}$. The relative phase shift between $SCLK_{CH1}$ and $SCLK_{CB}$ is established by initially setting the counter to an initial value that represents the required phase delay. In general, the initial values $i_j$ can be expressed by the formula $$i_j = \frac{\text{required phase delay}}{360°} \cdot 2k_j,$$

whereby $i_j$ represents the initial value for the j-th channel, whereby $i_j$, $k_j$ with j=1, ..., n are natural numbers, and whereby j=1, ..., n denotes the respective channel.

In our example, the phase delay has to be equal to 0.75×24 ns=18 ns, which corresponds to $0.75 \times 2k_1 = 0.75 \times 8 = 6$ signal periods of the underlying master clock signal MCLK2. Therefore, in case the counter for generating the transfer clock signal $SCLK_{CH1}$ is implemented as a downward counter, an initial value of 6 has to be written to said counter.

This initial value is decremented, in accordance with the master clock signal MCLK2, until the count value 0 is reached. At this point of time, the first rising edge 33 of the transfer clock signal $SCLK_{CH1}$ is generated, and the count value $(k_1-1)=4-1=3$ is loaded into the counter. After a complete counter cycle comprising 4 signal periods of MCLK2, the falling edge 34 of $SCLK_{CH1}$ is generated. In FIG. 2, the respective count values are indicated underneath the transfer clock signal $SCLK_{CH1}$.

So far, is has been explained how the transfer clock signals $SCLK_{CB}$ and $SCLK_{CH1}$, are generated, which both have a signal period of 24 ns, and which are phase-shifted by 270° relative to each other.

Figure 3:
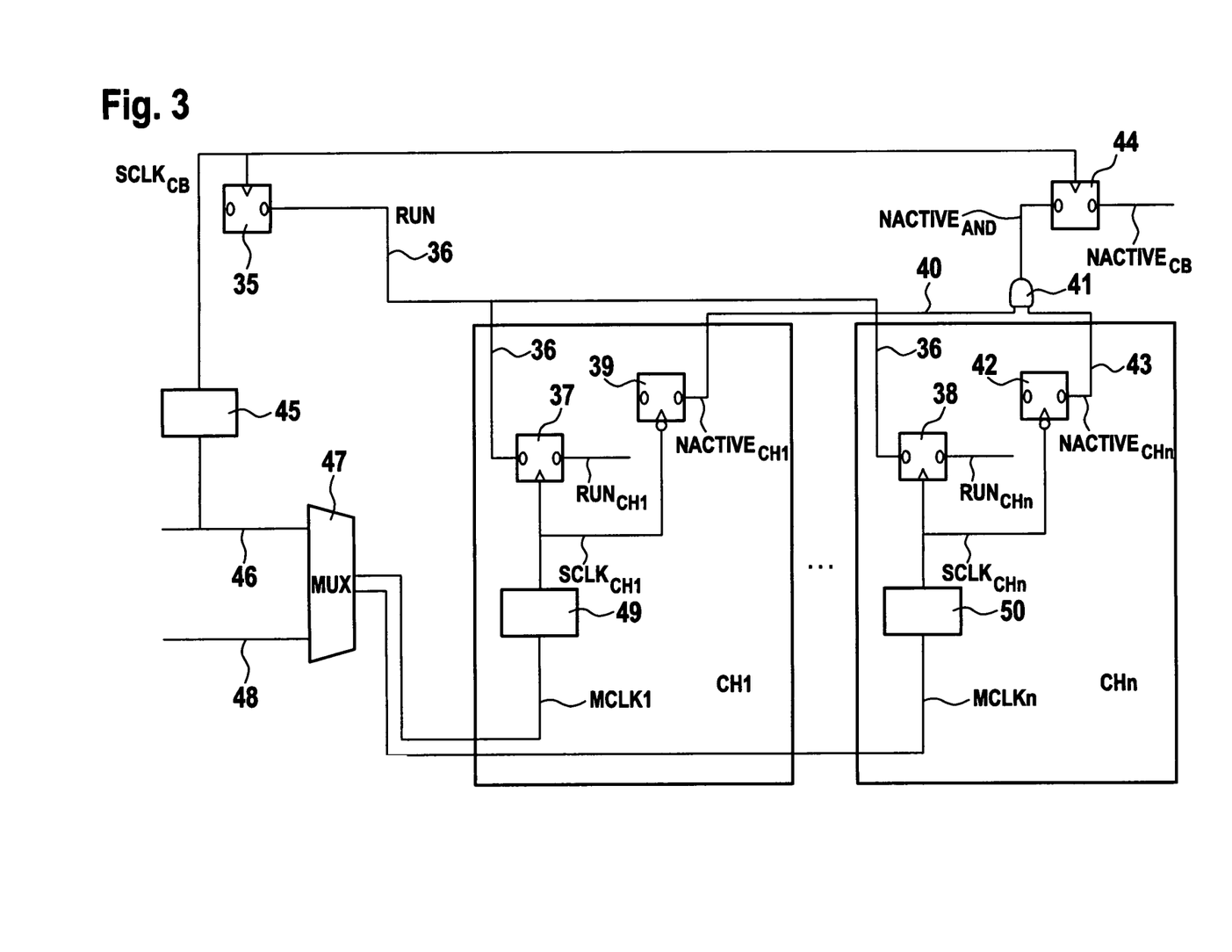
FIG. 3 depicts the interaction between the command RUN and the corresponding message NACTIVE.

In FIG. 3, it is shown how the transmission of commands and messages from the control board to a channel, and back from the channel to the control board is carried out. In particular, the interaction between the command RUN and the corresponding message NACTIVE is depicted, whereby the message NACTIVE indicates that a channel is not active. Initially, all the channels are inactive, and for this reason, the signals $NACTIVE_{CH1}$, $NACTIVE_{CH2}$, ... $NACTIVE_{CHn}$ are all set to "1" ("true"). The generation of signal patterns can be initiated by sending the command RUN from the system's central control facility to each of the channels. For example, the command RUN might initiate the generation of test vectors within an automated test equipment (ATE). By means of the command RUN, the control can be at least partially transferred from the control board to the respective control circuitry of the channels.

On the part of the control board CB, the command RUN is written to a flip-flop 35. With the next rising edge of the control board's transfer clock signal $SCLK_{CB}$, the command RUN is transmitted, via the signal line 36, to the channels CH1, CH2, ..., CHn. On the part of the respective channel, the signal line 36 is sampled in accordance with the respective channel's transfer clock signals $SCLK_{CH1}$, $SCLK_{CH2}$, ..., $SCLK_{CHn}$. The first channel CH1 comprises a flip-flop 37 for receiving the command RUN. The signal line 36 is connected to the data input D of the flip-flop 37, which is clocked by the transfer clock $SCLK_{CH1}$. Accordingly, the command RUN is sampled with each rising edge of the transfer clock signal $SCLK_{CH1}$, and at the output Q of the flip-flop 37, the sampled signal $RUN_{CH1}$ is obtained.

The circuitry of the $n^{th}$ channel CHn is also shown in FIG. 3. The $n^{th}$ channel CHn comprises a flip-flop 38 adapted for receiving the command RUN. The signal line 36 is connected to the data input D of the flip-flop 38, and the transfer clock signal $SCLK_{CHn}$ is provided to the flip-flop's clock input. The command RUN is sampled with each rising edge of the transfer clock signal $SCLK_{CHn}$ of the $n^{th}$ channel, and at the output Q of the flip-flop 38, the sampled signal $RUN_{CHn}$ is obtained.

As soon as the command RUN has been received by the channels, the channels CH1, ... CHn start executing their respective program routines, and accordingly, the signals $NACTIVE_{CH1}$, $NACTIVE_{CH2}$, ..., $NACTIVE_{CHn}$ are set to "0" ("false"), which means that the channels are busy. In order to transmit the signals $NACTIVE_{CH1}$, $NACTIVE_{CH2}$, ..., $NACTIVE_{CHn}$ from the channels to the control board, each of the channels comprises a flip-flop that contains the most recent value of the respective NACTIVE signal. The channel CH1 comprises a flip-flop 39 that is clocked by the inverted signal of the transfer clock signal $SCLK_{CH1}$. With each falling edge of the transfer clock $SCLK_{CH1}$ (which corresponds to a rising edge of the inverted transfer clock signal), the signal at the flip-flop's output Q is updated. At the output Q, the signal $NACTIVE_{CH1}$, is obtained, which is transmitted, via the signal line 40, to an AND-gate 41. The channel CHn comprises a flip-flop 42 that contains the actual value of the NACTIVE signal of the channel CHn. The flip-flop 42 is clocked by the inverted signal of the transfer clock signal $SCLK_{CHn}$, and with each falling edge of $SCLK_{CHn}$, the signal $NACTIVE_{CHn}$ at the flip-flop's output Q is updated. Via the signal line 43, the signal $NACTIVE_{CHn}$ is provided to the AND-gate 41. There, the signal $NACTIVE_{AND}$ is determined by ANDing the signals $NACTIVE_{CH1}$, $NACTIVE_{CH2}$, ..., $NACTIVE_{CHn}$:

$$NACTIVE_{AND} = \prod_{i=1}^{n} NACTIVE_{CHi}$$

If at least one of the channels CH1, CH2, ... CHn is active, the signal $NACTIVE_{AND}$ will be equal to "0" ("false"). As soon as all the channels have finished their tasks, all the signals $NACTIVE_{CHi}$, $i=1, 2, \ldots, n$ will assume the value "1" ("true"), and therefore, the signal $NACTIVE_{AND}$ will also assume the value "1" ("true"). Instead of utilizing an AND-gate, the signal $NACTIVE_{AND}$ might as well be determined by means of a WIRED-AND connection of the signals $NACTIVE_{CH1}$, $NACTIVE_{CH2}$, ..., $NACTIVE_{CHn}$.

The control board CB comprises a flip-flop 44 adapted for receiving the signal $NACTIVE_{AND}$. The signal $NACTIVE_{AND}$ is provided to the flip-flop's data input D, and the transfer clock signal $SCLK_{CB}$ is provided to the flip-flop's clock input. With each rising edge of $SCLK_{CB}$, the signal $NACTIVE_{AND}$ is sampled, and thus, the signal $NACTIVE_{CB}$ is obtained. A value "1" ("true") of the signal $NACTIVE_{CB}$ indicates that all the channels have completed their respective tasks. As soon as the signal $NACTIVE_{CB}$ is equal to "1", the control board will release the command RUN.

The transfer clock signal $SCLK_{CB}$ of the control board CB might be derived, by means of the clock frequency divider 45, from a master clock signal 46. The circuitry of FIG. 3 might further comprise a multiplexer 47 adapted for selecting either the master clock signal 46 or a remote master clock signal 48 as a respective channel's master clock signal MCLK1, MCLK2, ... MCLKn. Each of the channels comprises a clock frequency divider for deriving the channel's transfer clock signal from the channel's master clock signal. For example, the channel CH1 comprises a clock frequency divider 49 that derives the transfer clock signal $SCLK_{CH1}$ from the master clock signal MCLK. The channel CHn, which is also shown in FIG. 3, comprises a clock frequency divider 50 that converts the signal MCLKn into the signal $SCLK_{CHn}$.

Figure 4:
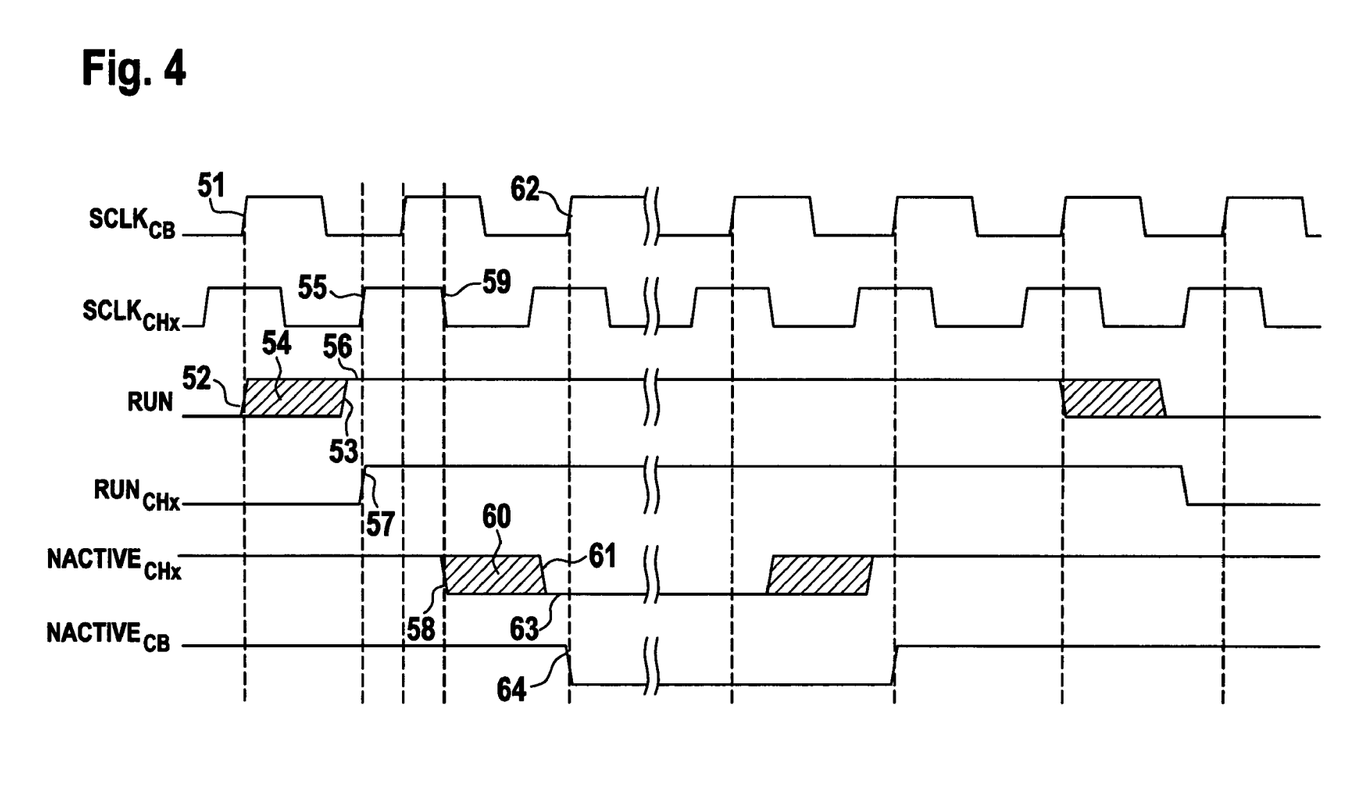
FIG. 4 shows a timing chart for some of the signals of FIG. 3.

FIG. 4 shows a timing chart for some of the signals of FIG. 3. In the upper part of FIG. 4, the control board's transfer clock signal $SCLK_{CB}$ and a transfer clock signal $SCLK_{CH1}$ of a channel are depicted as a function of time. It can be seen that the signal periods of $SCLK_{CB}$ and $SCLK_{CH1}$, are equal to each other, and that $SCLK_{CH1}$ is phase-shifted by 270° relative to $SCLK_{CB}$. Besides that, FIG. 4 shows the time dependence of the signals RUN, $RUN_{CH1}$, $NACTIVE_{CH1}$, and $NACTIVE_{CB}$. The command RUN is sent with the rising edge 51 of the control board's transfer clock $SCLK_{CB}$. The edge 52 indicates when the transmission of the command RUN is started, and the edge 53 indicates the arrival of the command RUN at the flip-flop 37 of the channel CH1. The hatched area 54 therefore corresponds to the propagation delay between the control board and the channel CH1.

On the part of the channel, the command RUN is sampled with the next rising edge 55 of the channel's transfer clock signal $SCLK_{CH1}$. If the period of time 56 between the edge 53 and the rising edge 55 is larger than the set-up time of the flip-flop 37, the command RUN will be sampled in accordance with the rising edge 55, and a signal transition 57 of the signal $RUN_{CH1}$ obtained at the output of the flip-flop 39 will be observed. The clock cycle-of-the transfer clock signals can always be chosen in a way that a respective command or message can propagate from the control board to the channels, or vice versa, in less than 0.75 transfer clock cycles, whereby the flip-flops' set-up times have to be considered.

Next, the message $NACTIVE_{CH1}$, has to be sent from the channel CH1 to the control board. The flip-flop 39 on the part of the channel CH1 is clocked by the inverted signal of the transfer clock signal $SCLK_{CH1}$, and therefore, the message $NACTIVE_{CH1}$ is sent (58) in accordance with the falling edge 59 of the channel's transfer clock signal $SCLK_{CH1}$. The propagation delay of the message $NACTIVE_{CH1}$ is indicated by the hatched area 60, and the edge 61 indicates the arrival of the ANDed signal $NACTIVE_{AND}$ at the flip-flop 44. Said flip-flop 44 is clocked by the transfer clock signal $SCLK_{CB}$, and therefore, the message $NACTIVE_{AND}$ is sampled with the rising edge 62 of $SCLK_{CB}$. At this point of time, the signal level at the flip-flop's data input D has already been equal to "0" for a period of time 63 that exceeds the set-up time of the flip-flop 44, and at the flip-flop's output Q, a falling edge 64 of the signal $NACTIVE_{CB}$ is obtained.

By establishing a relative phase delay of 270° between the transfer clocks of the control board and of the channels, three quarters of a transfer clock cycle are available for a transmission in a forward direction, and three quarters of a transfer clock cycle are available for a transmission in the opposite direction. In the timing chart of FIG. 4, $SCLK_{CB}$ leads in phase (by 270°) relative to $SCLK_{CH1}$. One might as well establish the transfer clocks in a way that $SCLK_{CB}$ lags in phase by 270° relative to $SCLK_{CH1}$.

The invention claimed is:

1. A multi-channel architecture comprising: a central facility that is under clock control of a central facility's clock signal; a central transfer clock generator adapted for deriving a central transfer clock signal from the central facility's clock signal; and a set of n channels, with n being a natural number, wherein each channel is under clock control of one out of a plurality of channel clock signals; with each of said channels comprising a channel transfer clock generator adapted for deriving a channel transfer clock signal from the channel clock signal of the respective channel; wherein said central facility's clock signal differs from at least one of said channel clock signals, and wherein the transfer clock period of said central transfer clock signal is substantially equal to each of the transfer clock periods of said channel transfer clock signals.

2. The multi-channel architecture of claim 1, wherein the transmission of at least one of messages and commands between the central facility and the channels is controlled by said central transfer clock signal and said channel transfer clock signals.

3. The multi-channel architecture of claim 1, wherein the common transfer clock period of said central transfer clock signal and said channel transfer clock signals is substantially a common multiple of the signal periods of the central facility's clock signal and the respective channel clock signals of the n channels.

4. The multi-channel architecture of claim 1, wherein said n channels are adapted for supplying other channels with respective channel transfer clock signals.

5. The multi-channel architecture according to claim 1, wherein at least one of said central transfer clock generator and said channel transfer clock generators is implemented as a programmable transfer clock generator.

6. The multi-channel architecture according to claim 1, wherein said central transfer clock generator comprises a first superperiod counter with a counter cycle $k_0$, whereby $k_0$ is a natural number.

7. The multi-channel architecture according to claim 6, wherein said first superperiod counter generates one clock period of the central transfer clock signal per 2 $k_0$ signal periods of the central facility's clock signal, whereby $k_0$ is a natural number.

8. The multi-channel architecture according to claim 1, wherein at least some of said channel transfer clock generators comprise second superperiod counters with respective counter cycles $k_j$, whereby $k_j$ with j=1, . . . , n are natural numbers, and whereby j=1, . . . , n denotes the respective channel.

9. The multi-channel architecture according to claim 8, wherein said second superperiod counters generate one clock period of the respective channel transfer clock signal per $2k_j$ signal periods of the clock signal of the j-th channel.

10. The multi-channel architecture according to claim 8, wherein at least one of the respective counter cycles $k_0$, $k_1$, . . . $k_n$ of said first and said second superperiod counters is programmed or reprogrammed by said central facility.

11. The multi-channel architecture according to claim 8, wherein the respective initial values of at least one of said first and said second superperiod counters are programmed or reprogrammed by said central facility.

12. The mufti-channel architecture according to claim 1, wherein said channel transfer clock signals are substantially in phase relative to each other.

13. The multi-channel architecture according to claim 1, wherein said central transfer clock signal is phase shifted by 0.55 to 0.95 transfer clock periods relative to said channel transfer clock signals.

14. The multi-channel architecture according to claim 1, wherein said central transfer clock signal is phase shifted by substantially 0.75 transfer clock periods relative to said channel transfer clock signals.

15. The multi-channel architecture according to claim 1, wherein in case said central transfer clock signal leads in phase relative to said channel transfer clock signals, a command or message is sent from said central facility to the channels with a rising edge of the central transfer clock signal, and is received on the part of the channels with a rising edge of the respective channel transfer clock signal.

16. The multi-channel architecture according to claim 1, wherein in case said central transfer clock signal leads in phase relative to said channel transfer clock signals, a command or message is sent in the direction from the channels to the central facility with a falling edge of the respective channel transfer clock signal, and is received on the part of said central facility with a rising edge of the central transfer clock signal.

17. The multi-channel architecture according to claim 1, wherein the central facility's clock signal and the channel clock signals of the channels are respectively selected from a set of master clock signals.

18. The multi-channel architecture according to claim 1, wherein said multi-channel architecture is an automated test equipment adapted for testing at least one DUT.

19. An automated test equipment with a plurality of channels adapted for testing at least one DUT, wherein the channels are responsible for at least one of: providing stimulus signals to said at least one DUT, and receiving response signals from said at least one DUT, comprising: a central facility that is under clock control of a central facility's clock signal; a central transfer clock generator adapted for deriving a central transfer clock signal from the central facility's clock signal; and a set of n channels, with n being a natural number, wherein each channel is under clock control of one out of a plurality of channel clock signals; with each of said channels comprising a channel transfer clock generator adapted for deriving a channel transfer clock signal from the channel clock signal of the respective channel; wherein said central facility's clock signal differs from at least one of said channel clock signals, and wherein the transfer clock period of said central transfer clock signal is substantially equal to each of the transfer clock periods of said channel transfer clock signals.

20. The automated test equipment of claim 19, wherein said automated test equipment comprises at least two test sites for testing at least two DUTs concurrently.

21. The automated test equipment according to claim 19, wherein the commands or messages that correspond to various different test sites are transmitted between the central facility and the channels in a time-multiplexed mode.

22. A method for providing transfer clock signals adapted for controlling the transmission of at least one of messages and commands between a central facility and a set of n channels, with n being a natural number, wherein said central facility is under clock control of a central facility's clock signal, and wherein each channel is under clock control of one out of a plurality of channel clock signals, said method comprising the steps of: deriving, on the part of the central facility, a central transfer clock signal from the central facility's clock signal; and deriving, on the part of the channels, channel transfer clock signals from the channel clock signals of the respective channels; wherein said central facility's clock signal differs from at least one of said channel clock signals, and wherein the transfer clock period of said central transfer clock signal is substantially equal to each of the transfer clock periods of said channel transfer clock signals.

23. The method of claim 22, wherein the common transfer clock period of said central transfer clock signal and said channel transfer clock signals is substantially a common multiple of the signal periods of the central facility's clock signal and the respective channel clock signals of the n channels.

24. A method for transmitting at least one of messages and commands from a central facility to at least one of a set of n channels, with n being a natural number, said method comprising the steps of: on the part of a central facility, sending a message or a command in accordance with a central transfer clock signal that is derived from the central facility's clock signal; and on the part of at least one of the channels, receiving said message or said command in accordance with channel transfer clock signals that are derived from the channel clock signals of the respective channels; wherein said central facility's clock signal differs from at least one of said channel clock signals, and wherein the transfer clock period of said central transfer clock signal is substantially equal to the transfer clock periods of said channel transfer clock signals.

25. The method of claim 24, wherein the common transfer clock period of said central transfer clock signal and said channel transfer clock signals is substantially a common multiple of the signal periods of the central facility's clock signal and the respective channel clock signals of the n channels.

26. A method for transmitting at least one of messages and commands from at least one of a set of n channels to a central facility, with n being a natural number, said method comprising the steps of: on the part of at least one of the channels, sending a message or a command in accordance with channel transfer clock signals that are derived from channel clock signals of the respective channels; and on the part of the central facility, receiving said message or command in accordance with a central transfer clock signal that is derived from a central facility's clock signal; wherein said central facility's clock signal differs from at least one of said channel clock signals, and wherein the transfer clock period of said central transfer clock signal is substantially equal to the transfer clock periods of said channel transfer clock signals.

27. The method of claim 26, wherein the common transfer clock period of said central transfer clock signal and said channel transfer clock signals is substantially a common multiple of the signal periods of the central facility's clock signal and the respective channel clock signals of the n channels.

28. A non-transitory computer-readable media having stored thereon a software program or product for executing a method when run on a data processing system such as a computer or a digital signal processor, said method for providing transfer clock signals adapted for controlling the transmission of at least one of messages and commands between a central facility and a set of n channels, with n being a natural number, wherein said central facility is under clock control of a central facility's clock signal, and wherein each channel is under clock control of one out of a plurality of channel clock signals, said method comprising the steps of: deriving, on the part of the central facility, a central transfer clock signal from the central facility's clock signal; and deriving, on the part of the channels, channel transfer clock signals from the channel clock signals of the respective channels; wherein said central facility's clock signal differs from at least one of said channel clock signals, and wherein the transfer clock period of said central transfer clock signal is substantially equal to each of the transfer clock periods of said channel transfer clock signals.

29. A non-transitory computer-readable media having stored thereon a software program or product for executing a method when run on a data processing system such as a computer or a digital signal processor, said method for transmitting at least one of messages and commands from a central facility to at least one of a set of n channels, with n being a natural number, said method comprising the steps of: on the part of the central facility, sending a message or a command in accordance with a central transfer clock signal that is derived from the central facility's clock signal; and on the part of at least one of the channels, receiving said message or said command in accordance with channel transfer clock signals that are derived from channel clock signals of the respective channels; wherein said central facility's clock signal differs from at least one of said channel clock signals, and wherein the transfer clock period of said central transfer clock signal is substantially equal to the transfer clock periods of said channel transfer clock signals.

30. A non-transitory computer-readable media having stored thereon a software program or product for executing a method when run on a data processing system such as a computer or a digital signal processor, said method for transmitting at least one of messages and commands from at least one of a set of n channels to a central facility, with n being a natural number, said method comprising the steps of: on the part of at least one of the channels, sending a message or a command in accordance with channel transfer clock signals that are derived from channel clock signals of the respective channels; and on the part of the central facility, receiving said message or command in accordance with a central transfer clock signal that is derived from a central facility's clock signal; wherein said central facility's clock signal differs from at least one of said channel clock signals, and wherein the transfer clock period of said central transfer clock signal is substantially equal to the transfer clock periods of said channel transfer clock signals.

* * * * *